(12) United States Patent
Woo et al.

(10) Patent No.: US 6,562,717 B1
(45) Date of Patent: May 13, 2003

(54) SEMICONDUCTOR DEVICE HAVING MULTIPLE THICKNESS NICKEL SILICIDE LAYERS

(75) Inventors: Christy Mei-Chu Woo, Cupertino, CA (US); George Jonathan Kluth, Sunnyvale, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/679,874

(22) Filed: Oct. 5, 2000

(51) Int. Cl.$^7$ ............................................... H01L 21/44
(52) U.S. Cl. ...................... 438/674; 438/682
(58) Field of Search .................. 438/275, 299, 438/197, 224, 682, 674, 647; 257/204

(56) References Cited

U.S. PATENT DOCUMENTS

| | | | | |
|---|---|---|---|---|
| 5,283,449 A | * | 2/1994 | Ooka | 257/204 |
| 5,352,631 A | * | 10/1994 | Sitaram et al. | 438/300 |
| 5,723,377 A | * | 3/1998 | Torii | 438/303 |
| 5,953,612 A | * | 9/1999 | Lin et al. | 438/299 |
| 5,960,270 A | * | 9/1999 | Misra et al. | 438/197 |
| 6,204,103 B1 | * | 3/2001 | Bai et al. | 438/224 |
| 6,225,166 B1 | * | 5/2001 | Hsu et al. | 438/275 |
| 6,306,698 B1 | * | 10/2001 | Wieczorek et al. | 438/197 |
| 2001/0045605 A1 | * | 11/2001 | Miyashita et al. | 247/382 |

OTHER PUBLICATIONS

Spectroscopic ellipsometry investigation of nickel silicide formation by rapid thermal process. Yaozhi Hu, Sing Pin Tay, Feb. 9, 1998 pp. 1820–1824.
Properties of Metal–Silicides–Kinetics of formation of TM Silicide thin fils: self–diffusion P. Gas, F.M. d'Heurle, Jan. 1995 pp. 279–292.

* cited by examiner

Primary Examiner—William David Coleman

(57) ABSTRACT

A method of manufacturing a semiconductor device includes providing a gate electrode having first and second opposing sidewalls over a substrate having source/drain regions; forming first and second sidewall spacers respectively disposed adjacent the first and second sidewalls; and forming first and second nickel silicide layer respectively disposed on the source/drain regions and the gate electrode. The nickel silicide layer over the gate electrode can be thicker than the nickel silicide layer over the source/drain regions. A semiconductor device formed from the method is also disclosed.

14 Claims, 7 Drawing Sheets

SEMICONDUCTOR DEVICE HAVING MULTIPLE THICKNESS NICKEL SILICIDE LAYERS

RELATED APPLICATIONS

This application contains subject matter related to the subject matter disclosed in U.S. patent application Ser. No. 09/729,700 filed on Dec. 6, 2000.

FIELD OF THE INVENTION

The present invention relates to the manufacturing of semiconductor devices, and more particularly, to nickel silicide processes that prevent junction leakage current.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modem electronic circuits. Importantly, these electronic circuits realize improved performance and lower costs, as the performance of the MOS transistor is increased and as manufacturing costs are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

MOS devices typically fall in one of two groups depending the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A type of device, commonly referred to as a MOS field-effect-transistor (MOSFET), includes a channel region formed in the semiconductor substrate beneath the gate area or electrode and between the source and drain regions. The channel is typically lightly doped with a dopant having a conductivity type opposite to that of the source/drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to control the current flow through the channel region.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the dimensions of the MOSFET shrinks, contacts and spacing between contacts also decrease in size, and increased performance requires that contact resistance remain relatively low. Contacts are formed after the source/drain regions have been formed within the semiconductor substrate of the MOSFET and the gate areas defined. An interlevel dielectric is then formed across the topography to isolate the gate areas and the source/drain regions. Interconnect routing is then placed across the semiconductor topography and connected to the source/drain regions and/or the gate areas by ohmic contacts formed through the interlevel dielectric.

The entire process of making ohmic contacts to the impurity regions and/or the gate areas and routing interconnect material between the ohmic contacts is described generally as "metallization". The term metallization is generic in its application, as conductive materials other than metal are commonly used for metallization. As the complexity of integrated circuits has increased, the complexity of the metallization composition has also increased, which leads to a further problem.

Metallization typically involves patterning a protective mask upon areas of the interlevel dielectric exclusive of where the ohmic contact is to be formed. The area of the interlevel dielectric left uncovered by the mask is then etched to form an opening or window directly above the source/drain regions and/or the gate areas to which contact is to be made. The contact window is then filled with a conductive material. A problem associated with this process is that the mask, and hence the contact, may be misaligned with the areas to which contact is to be made, resulting in increased resistance at that interface. Furthermore, aligning contact windows via a separate masking step makes minimizing the size of source/drain regions difficult.

Performance improvements have been obtained by solving the problems of increased resistance and misalignment through use of a salicide process (Self-ALIgned-siliCIDE). This process has become a mainstay in semiconductor processing because the process produces contacts having low-ohmic resistance and the contacts are formed using a self-aligned process.

A salicide process involves depositing a refractory metal across the semiconductor topography. After the refractory metal is deposited and subjected to high enough temperature, a silicide reaction occurs wherever the metal is in contact with a region heavily concentrated with silicon. In this manner, metal silicide may be formed exclusively upon the source/drain regions and the upper surface of a polycrystalline silicon ("polysilicon") gate conductor interposed between the source/drain regions. Silicide formation formed upon a polysilicon gate is generally referred to as polycide gate, which significantly reduces the resistance of the gate structure, as compared to previously used polysilicon gate structures. Silicide formation on the source/drain regions also significantly reduce the resistance of the contacts to the source/drain regions. Any unreacted metal is removed after formation of the silicide.

A number of different techniques and fabrication processes have been used to form MOSFET devices using the salicide process. With reference to FIGS. 1A–1I, one typical MOSFET fabrication process according to conventional techniques will be described. In FIG. 1A, separate MOSFET devices are separated on a silicon substrate 102 using isolation structures, such as a field oxide (not shown) or a shallow isolation trench 216. A shallow isolation trench 216, for example, can be formed by etching either isotropically with wet techniques or anisotropically with dry etch techniques. An oxide 218 is thereafter deposited within the trench 216. The oxide 218 is deposited such that an edge 220 of the oxide 218 meets the substrate 102 at what will later be lightly doped regions within the substrate 102. For purposes of clarity, the trench 216 and the oxide 218 are not shown in FIGS. 1B–1I.

In FIG. 1B, a gate oxide 104, formed from silicon dioxide, is formed on the top surface of the substrate 102 using thermal oxidation at temperatures from 700 to 1000° C. in an oxygen atmosphere. After deposition of the gate oxide 104, a blanket layer of undoped polysilicon 106 is deposited, for example by low pressure chemical vapor deposition (LPCVD), on the top surface of gate oxide 104. The polysilicon layer 106 deposited on the substrate 102 can then be implanted with nitrogen ions, as depicted by arrows 160. The nitrogen ions are added to retard the diffusion of boron atoms.

In FIG. 1C, a photoresist 110 is deposited as a continuous layer on the polysilicon layer 106, and the photoresist 10 is selectively irradiated using a photolithographic system, such as a step and repeat optical projection system, in which ultraviolet light from a mercury-vapor lamp is projected through a first reticle and a focusing lens to obtain a first image pattern. The photoresist 110 is then developed and the irradiated portions of the photoresist are removed to provide openings in the photoresist 110. The openings expose portions of the polysilicon layer 106 which will thereby define a gate electrode.

In FIG. 1D, an anisotropic etch is applied to remove the exposed portions of the polysilicon layer 106 and the underlying portions of the gate oxide 104. After etching, the remaining portion of polysilicon layer 106 provides a polysilicon gate 112 with opposing vertical sidewalls (or, edges) 114, 116.

In FIG. 1E, the photoresist 110 is stripped, and lightly doped (LDD) source/drain regions 130, 132 are formed by an ion implantation, as represented by arrows 128. The ion implantation may be an n-type dopant, such as arsenic, if an NMOSFET is desired, or a p-type dopant, such as boron, if a PMOSFET is desired. The LDD source/drain regions 130, 132 are formed within the substrate 102 immediately adjacent to the sidewalls 114, 116 and are self-aligned with the polysilicon gate 112.

In FIG. 1F, sidewall spacers 162, 164 are formed following the implantation of the LDD source/drain regions 130, 132. The sidewall spacers 162, 164 may be silicon nitride or, alternatively, silicon oxide formed from material such as plasma-enhanced oxide (PEOX) or tetraethoxysilane (TEOS) oxide. The sidewall spacers 162 and 164 are formed immediately adjacent to the polysilicon gate 112 and over the substrate 102. After formation of the sidewall spacers 162, 164, heavily doped (HDD) source/drain regions 200, 202 are formed by a second ion implantation, as represented by arrows 204. The HDD source/drain regions 200, 202 are formed within the substrate 102 and extend past the LDD regions 130, 132 immediately adjacent to the sidewall spacers 162, 164. The sidewall spacers 162, 164 act as masks, which protect portions of the LDD regions 130, 132 from being heavily doped.

In FIG. 1G, a metal silicide is formed following the creation of the source/drain regions 130, 132. This process involves blanket depositing a layer of nickel 140, or other metals such as titanium and cobalt, over the polysilicon gate electrode 112 and the source/drain regions 130, 132 of the substrate 102. Although titanium and cobalt have been used to form silicide layers, nickel silicide (NiSi) has recently become a preferred silicide material for several reasons. An advantage of nickel silicide is that it can be rapidly formed at low temperature (400–600° C.), making it suitable for low temperature processes in MOSFET fabrication. Other advantages of nickel silicide include no linewidth dependence, a reduction in "creep up" phenomenon, low resistivity, a one-step anneal, a larger process window, and low silicon consumption. Yaozhi Hu and Sing Pin Tay, "Spectroscopic Ellipsometry Investigation of Nickel Silicide Formation by Rapid Thermal Process", J. Vac. Sci. Technol. A 16(3), May/June 1998, 1820.

In FIG. 1H, the nickel layer 140 is transformed into nickel silicide 142 by a one-step thermal process, which causes the underlying silicon substrate 102 or polysilicon gate electrode 112 to react with the nickel layer 140 to form nickel silicide 142. This thermal process is typically a rapid thermal anneal at temperatures of between about 350° C. to 750° C. A typical process is a 550° C. anneal for about 40 seconds in a nitrogen atmosphere. The formation of nickel silicide begins at about 250° C. when the nickel layer 140 reacts with silicon 102, 112 to form a $Ni_2Si$ film. With an increase in time or an increase in temperature to above 300° C., the $Ni_2Si$ film reacts with the silicon 102, 112 to form the NiSi layer 142. The square of the thickness of the NiSi layer 142 varies linearly with time and the reaction proceeds until the $Ni_2Si$ film is totally consumed. P. Gas and F. M. d'Heurle, "Kinetics of Formation of TMM Silicide Thin Films: Self-diffusion", Properties of Metal Silicides, January 1995, 279.

In FIG. 1I, the nickel layer 140 over the sidewall spacers 162, 164 and the shallow isolation trench 216 is not reacted and can be removed easily. The unreacted nickel layer 140 can be removed, for example, using a $H_2SO_4+H_2O_2$ (2:1) mixture at a temperature of about 100° C. Although $NH_4OH+H_2O_2$ with deionized water is used for stripping silicide metals, such as with cobalt, titanium, or titanium nitride, this particular etch is not used with nickel. Nickel does not have a cap layer above the silicide metal, unlike the other materials, and removal of the cap layer is the main reason that $NH_4OH+H_2O_2$ with deionized water is used for the other types of silicides.

A problem that can be caused by this process is the creation of junction leakage current. As the distance between the source region and the drain region of the MOSFET (i.e., the physical channel length) decreases, in the effort to increase circuit speed and complexity, the depth of source/drain regions must also be reduced to prevent unwanted source/drain-to-substrate junction capacitance. Also, as the source/drain regions become more shallow, a greater consumption of the silicon within the source/drain regions occurs during salicide processing. In particular, conventional salicide processing typically results in 100 to 200 angstroms of the source/drain region being consumed.

The consumption of silicon during the salicide process limits the thickness of the nickel silicide layer over the source/drain regions. In current processing techniques, this also limits the thickness of the nickel silicide layer over the gate electrode. However, if a thicker nickel silicide layer can be provided over the gate electrode, resistance of the gate electrode will decrease and the speed of the semiconductor device will advantageously increase.

The above-described problem is illustrated in FIG. 2. If a thick nickel silicide layer 142 is formed to decrease the resistance of the gate electrode 112, the nickel silicide layer 142 can also extend up to or through the source/drain regions 130, 132, which can cause junction leakage. The problem of junction leakage can also be exacerbated by a rough or wavy interface between the nickel silicide 142 and the source/drain regions 130, 132. This rough interface is caused by the thickness of the nickel silicide 142 increasing by up to 40% over an expected thickness. With nickel silicide 142, nickel is the diffusing species, and interdiffusion of the nickel into the source/drain regions 130, 132 can be so extensive that in some instances, the nickel silicide can "spike" through relatively shallow source/drain regions 130, 132, thereby causing the rough interface.

The nickel silicide 142 penetrating below the depth of the source/drain regions 130, 132 into the bulk substrate 102 can result in the source/drain regions 130, 132 experiencing current leakage or even becoming electrically shorted. Accordingly, a need exists for an improved method of nickel silicide formation that allows a thick nickel silicide layer to be formed over the gate electrode without causing junction leakage caused by excess penetration of the nickel silicide layer into the source/drain active regions.

SUMMARY OF THE INVENTION

This and other needs are met by embodiments of the present invention which provide a MOSFET semiconductor device, which includes a substrate, a gate electrode, a gate oxide, first and second sidewall spacers, and first and second nickel silicide layers. The gate oxide is disposed between the gate electrode and the substrate, and the substrate includes source/drain regions. The gate electrode has first and second opposing sidewalls, and the first and second sidewall spacers are respectively disposed adjacent the first and second sidewalls. The first nickel silicide layer is disposed on the source/drain regions and has a first thickness. The second nickel silicide layer is disposed on the gate electrode and has a second thickness greater than the first thickness.

By providing nickel silicide layers, each having different thickness, the present invention can reduce the resistance of the gate electrode with a thick nickel silicide layer, thereby increasing the speed of the semiconductor device. Furthermore, the depth of the source/drain region can remain shallow with a thin nickel silicide layer, thereby preventing unwanted source/drain-to-substrate junction capacitance.

In an additional embodiment of the present invention, a method of manufacturing a semiconductor device is also disclosed. The method of manufacturing includes providing a gate electrode having first and second opposing sidewalls over a substrate having source/drain regions; forming first and second sidewall spacers respectively disposed adjacent the first and second sidewalls; and forming first and second nickel silicide layer respectively disposed on the source/drain regions and the gate electrode. The nickel silicide layer over the gate electrode can be thicker than the nickel silicide layer over the source/drain regions.

In an additional aspect of the invention, the first nickel silicide layer is provided by forming a first protective layer over the gate electrode and source/drain regions; patterning and etching the first protective layer to expose the source/drain regions and form a gate electrode protective layer over the gate electrode; and depositing a first nickel layer over the source/drain regions and the gate electrode followed by annealing. The second nickel silicide layer is then provided by forming a second protective layer over the gate electrode and source/drain regions; patterning and etching the second protective layer and the gate electrode protective layer to expose the gate electrode while covering the source/drain regions, and depositing a second nickel layer over the source/drain regions and the gate electrode followed by annealing.

In still further aspects of the invention, the thickness of the nickel silicide layer over the source/drain regions can be from about 100 to 400 angstroms, and the thickness of the nickel silicide layer over the gate electrode can be from about 1350 to 1500 angstroms. Also, the gate electrode protective layer can have a thickness from about 300 to 1000 angstroms, and the second protective layer can have a thickness from about 500 to 1000 angstroms. Furthermore, the process can include the steps of removing unreacted nickel after the first nickel silicide layer is formed and removing unreacted nickel after the second nickel silicide layer is formed.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of junction leakage as a result of nickel silicide spiking through a shallow source/drain region when a thick nickel silicide layer is desired to decrease the resistance of the gate electrode. This is achieved, in part, by creating two nickel silicide layers, each having a different thickness. Advantageously, the resistance of the gate electrode with a thick nickel silicide layer allows for increased speed of the semiconductor device. Furthermore, the depth of the source/drain region can remain shallow with a thin nickel silicide layer, which prevents unwanted source/drain-to-substrate junction capacitance.

Figure 1A:
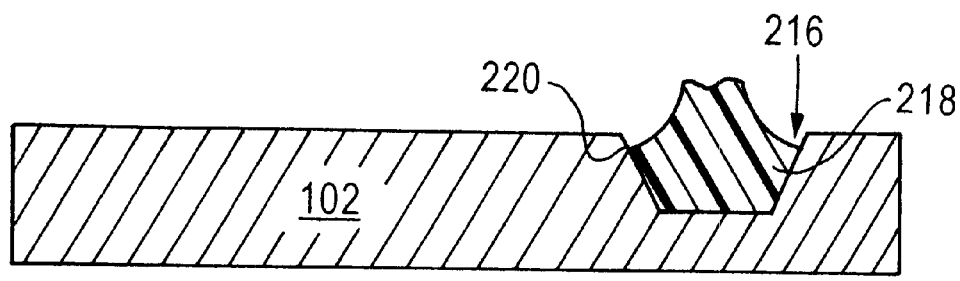
FIGS. 1A–1I schematically illustrate sequential phases of a conventional MOS fabrication method using a salicide process.
Figure 1B:
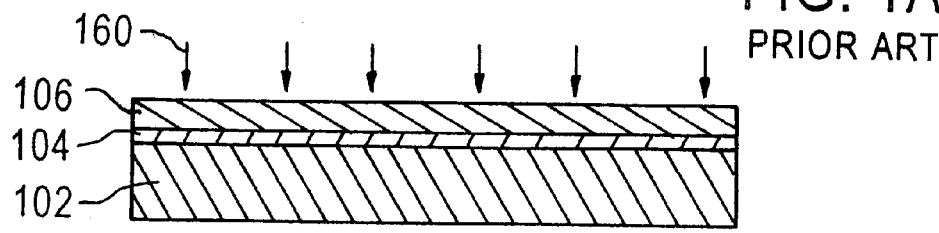
Figure 1C:
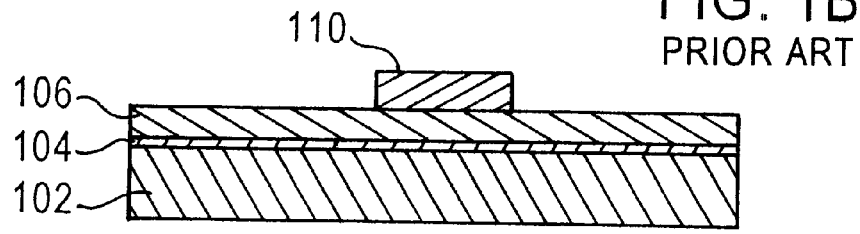
Figure 1D:
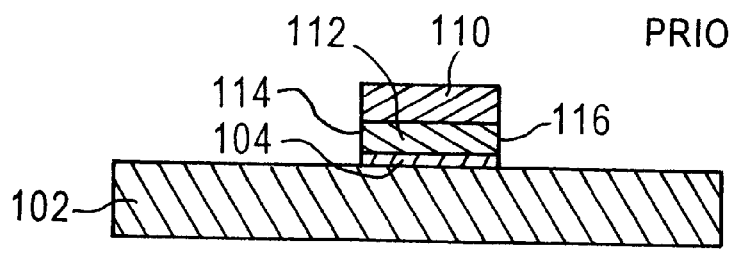
Figure 1E:
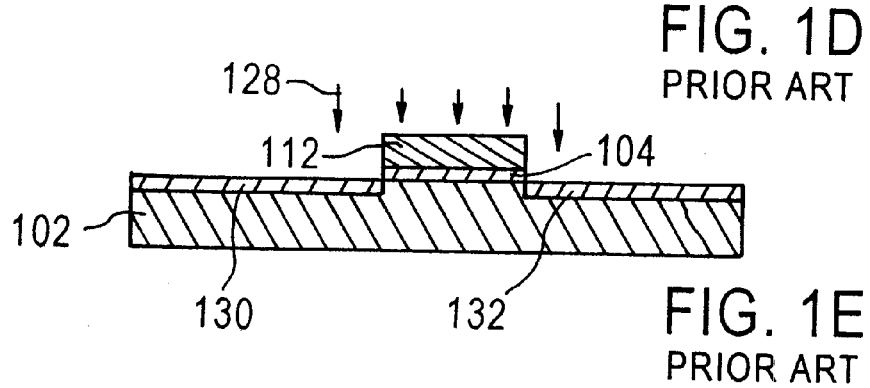
Figure 1F:
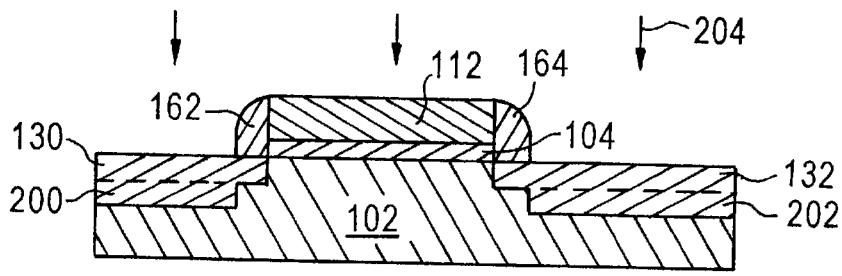
Figure 1G:
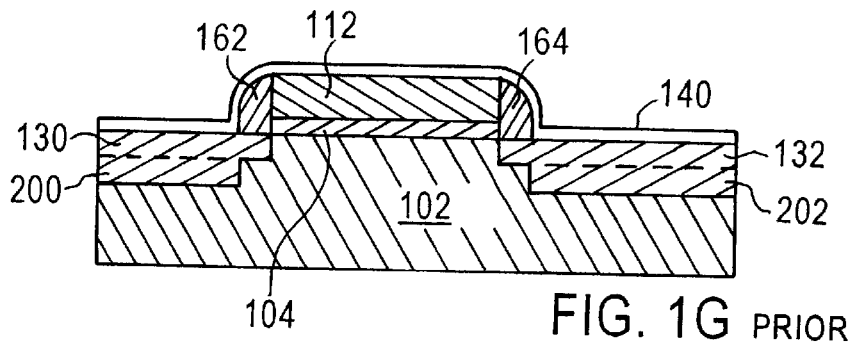
Figure 1H:
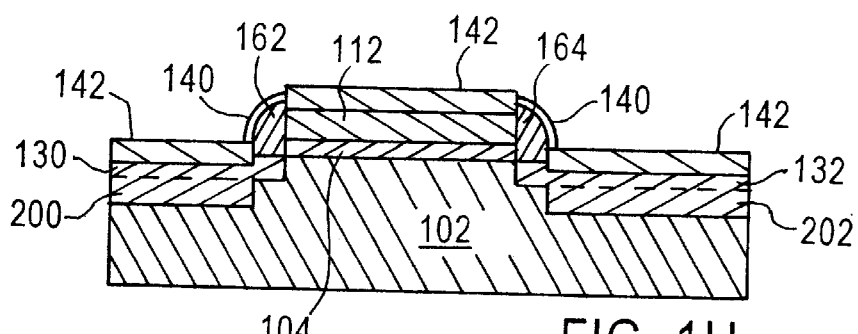
Figure 1I:
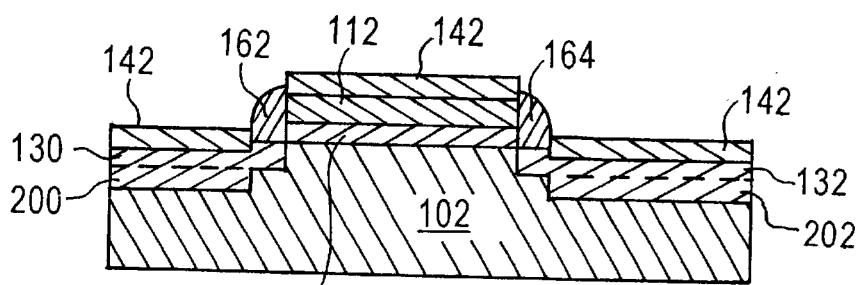
Figure 2:
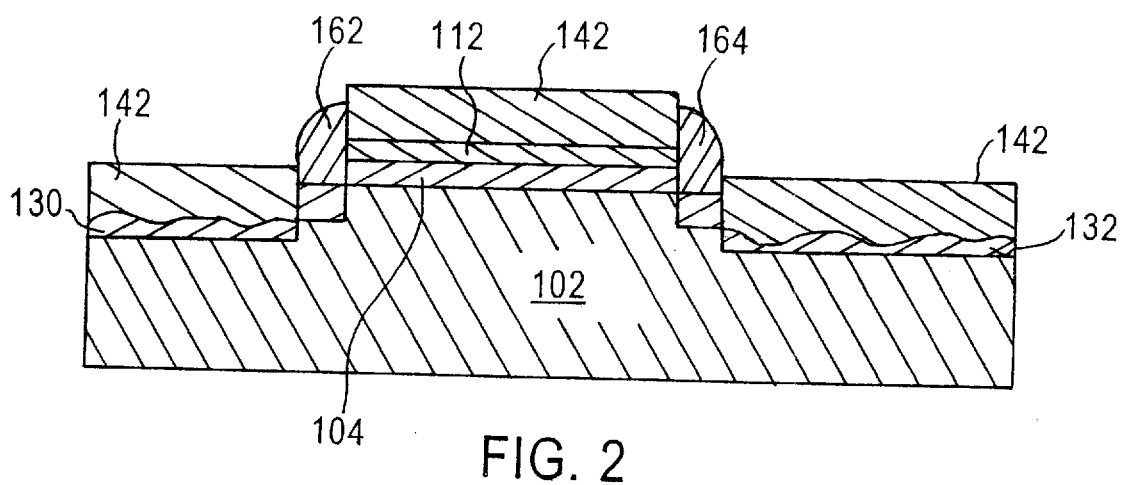
FIG. 2 illustrates a MOS device showing a nickel silicide layer penetrating past the depth of the source/drain regions.
Figure 3A:
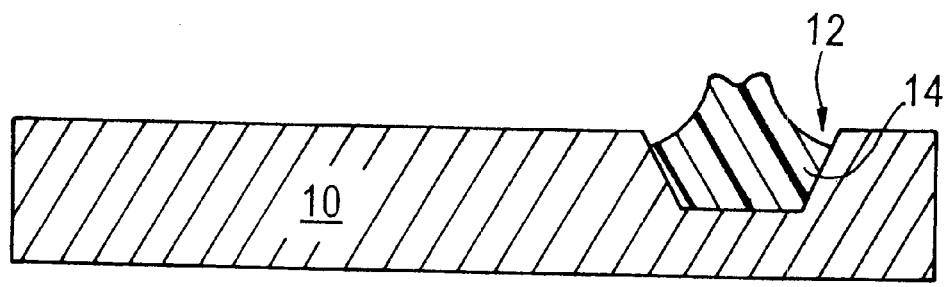
FIGS. 3A–3O schematically illustrate sequential phases of a MOS fabrication method using a salicide process according to an embodiment of the present invention.
Figure 3B:
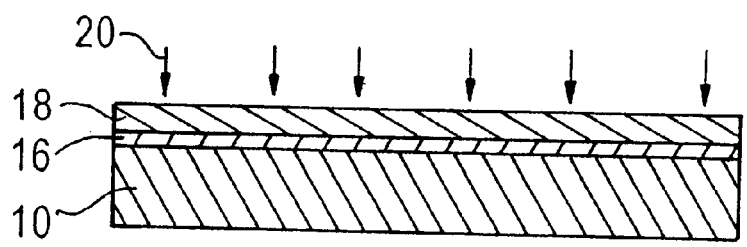
Figure 3C:
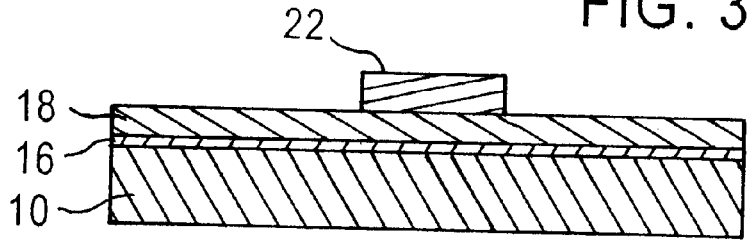
Figure 3D:
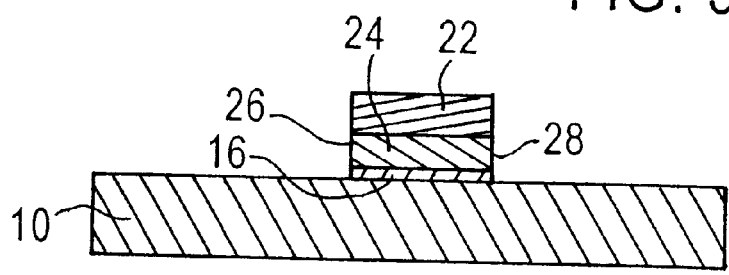
Figure 3E:
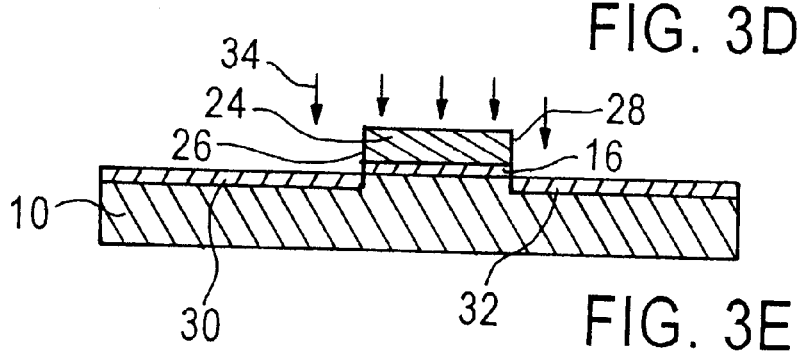
Figure 3F:
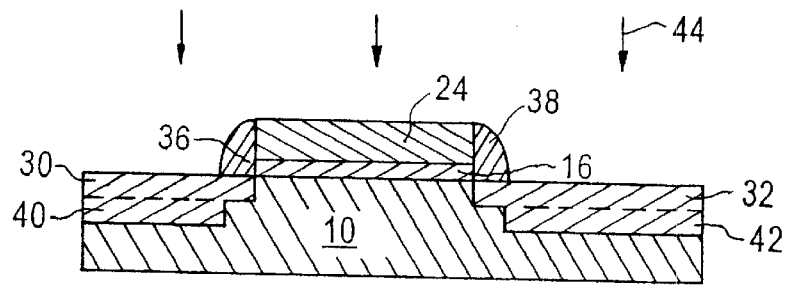
Figure 3G:
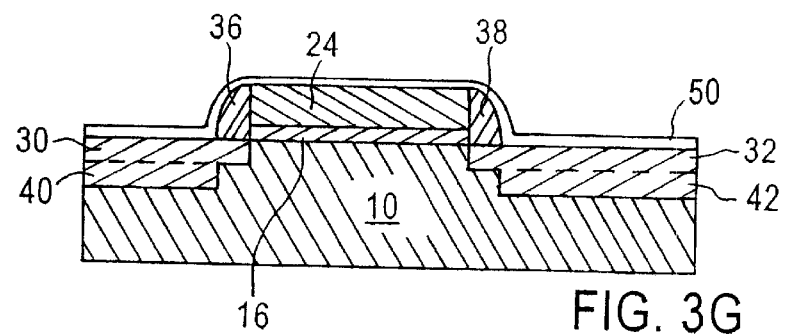
Figure 3H:
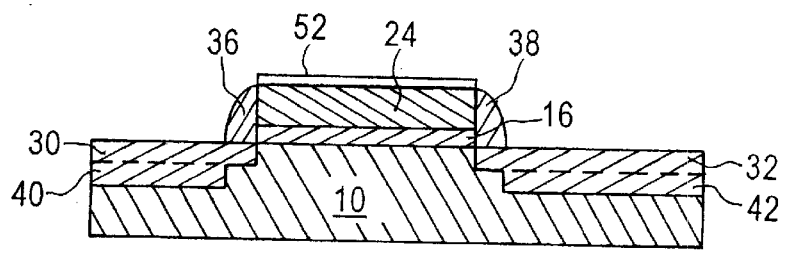
Figure 3I:
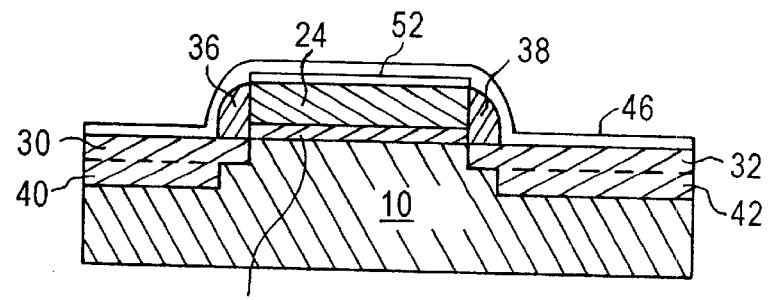
Figure 3J:
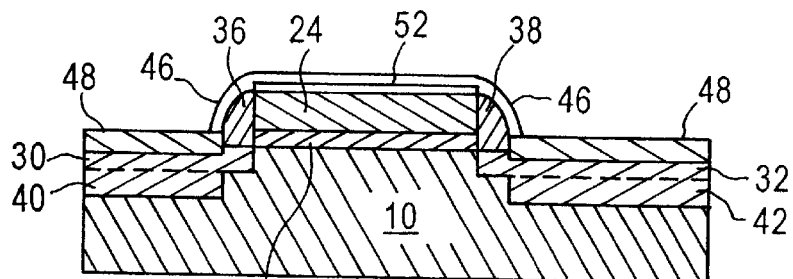
Figure 3K:
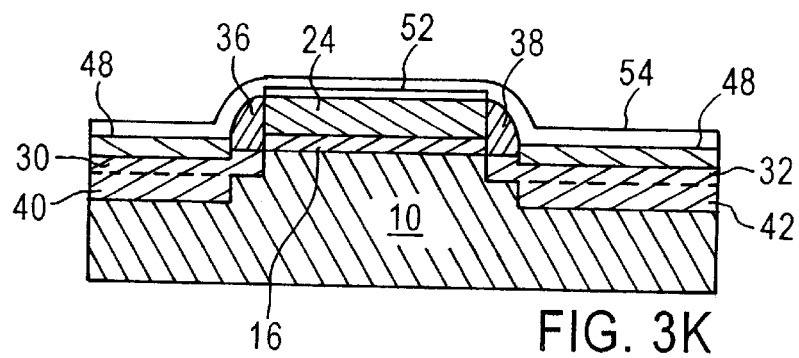
Figure 3L:
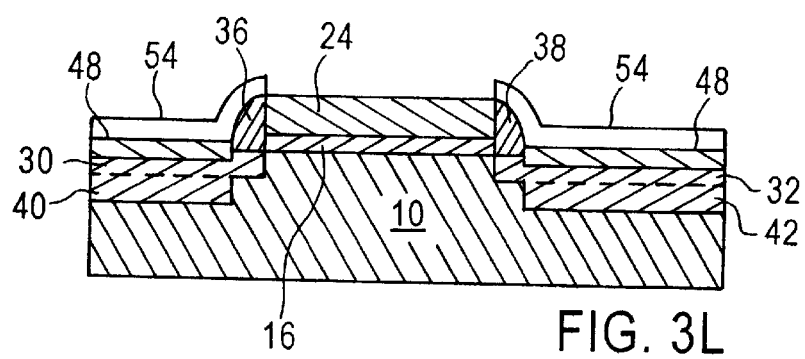
Figure 3M:
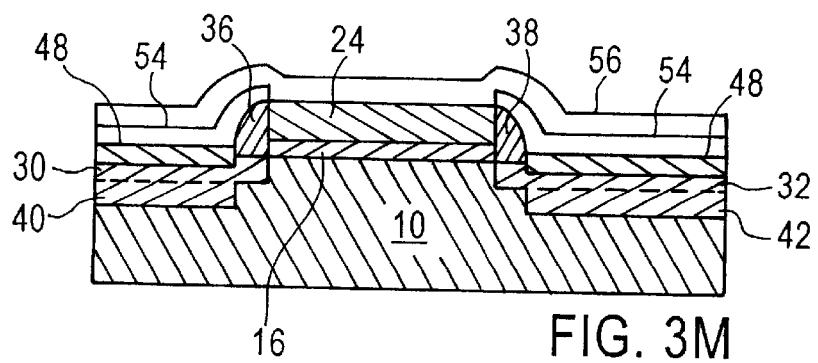
Figure 3N:
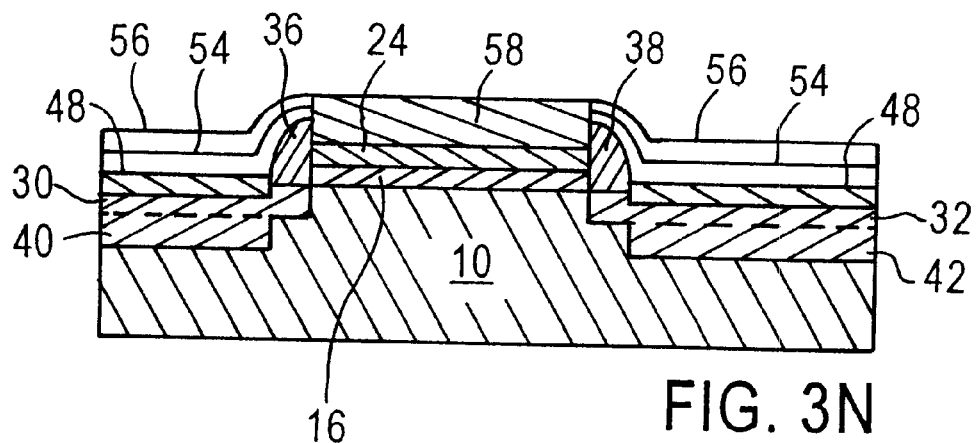
Figure 3O:
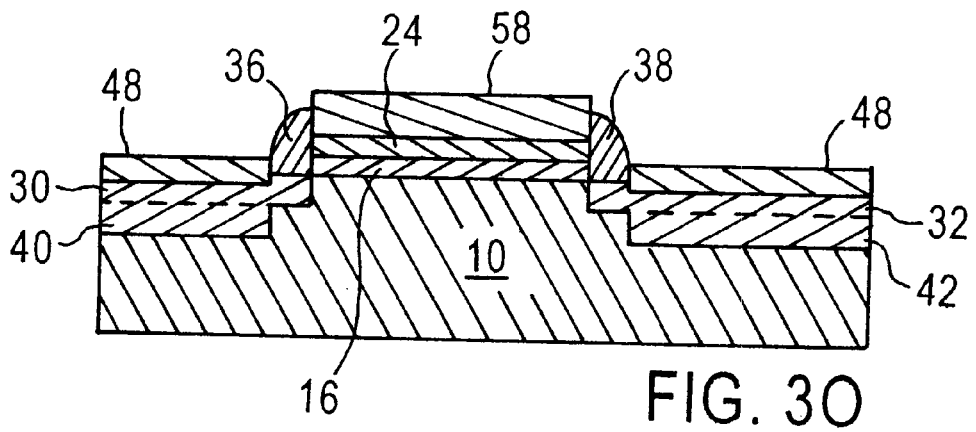

An embodiment of the present invention is illustrated in FIGS. 3A–3O. As illustrated in FIG. 3A, a silicon substrate 10 is provided and can be formed from any material suitable for integrated circuit manufacture. However, in current embodiments of the invention, the substrate 10 is formed from single-crystal silicon, with a <100> crystallographic orientation and which has been slightly doped with n-type or p-type impurities. Separate MOS devices are separated on a silicon substrate 10 using isolation structures, such as a field oxide (not shown) or a shallow isolation trench 12. A shallow isolation trench 12, for example, can be formed by etching either isotropically with wet techniques or anisotropically with dry etch techniques. An oxide 14 is thereafter deposited within the trench 12. For purposes of clarity, the trench 12 and the oxide 14 are not shown in FIGS. 3B–3O.

As an alternative to the shallow isolation trench 12, a field oxide can be formed. A field oxide can be formed via thermal oxidation in an oxygen-steam ambient at temperatures from about 850 to 1050° C. A patterned, oxidation-resistant mask is used to prevent oxidation of non-isolation device regions. After formation of the field oxide, the mask is removed using known techniques, for example hot phosphoric acid for a silicon nitride mask or buffered hydrofluoric acid for a pad oxide mask.

In FIG. 3B, a gate oxide 16, comprised of silicon dioxide, is formed on the top surface of the substrate 10 using thermal oxidation at temperatures from about 700 to 1000° C. in an oxygen-steam ambient. The gate oxide 16 can have a thickness from about 30 to 200 angstroms. After deposition of the gate oxide 16, a blanket layer of undoped polysilicon 18 is deposited, for example by low pressure chemical vapor deposition (LPCVD) at temperatures from about 600 to 800° C., on the top surface of gate oxide 16. The polysilicon layer 18 can have a thickness from about 500 to 5000 angstroms. The polysilicon layer 18 can then be implanted with nitrogen ions, as depicted by arrows 20. The implanted nitrogen ions, for example, can be used to retard the diffusion of boron atoms. The polysilicon layer 18 can be implanted with nitrogen ions at a dosage from about $5\times10^{14}$ to $5\times10^{15}$ dopants/cm$^2$, and at an energy level from about 20 to 200 keV.

In FIG. 3C, a photoresist 22 is deposited as a continuous layer on the polysilicon layer 18, and the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which will thereby define a gate electrode.

In FIG. 3D, an anisotropic etch is applied to remove the exposed portions of the polysilicon layer 18 and the underlying portions of the gate oxide 16. After etching, the remaining portion of polysilicon layer 18 provides a polysilicon gate electrode 24 having opposing vertical sidewalls 26, 28. The length of the polysilicon gate electrode 24 between the sidewalls 26, 28 can be from about 500 to 2500 angstroms.

In FIG. 3E, the photoresist 22 is stripped, and lightly doped (LDD) source/drain active regions 30, 32 are formed by an ion implantation, as represented by arrows 34. The ion implantation may be an n-type dopant, such as arsenic, if an NMOSFET is desired, or a p-type dopant, such as boron, if a PMOSFET is desired. Illustrative examples of implant energies and dosages for doping respectively range from about 2 to 20 keV and from about $5\times10^{14}$ to $3\times10^{15}$ dopants/cm$^2$. The LDD source/drain regions 30, 32 are formed within the substrate 10 immediately adjacent to the sidewalls 26, 28 and are self-aligned with the polysilicon gate electrode 24 and the isolation structure.

In FIG. 3F, sidewall spacers 36, 38 are formed following the implantation of the LDD source/drain regions 30, 32. Formation of the sidewall spacers 36, 38 involves blanket depositing a spacer material over the substrate 10. The spacer material can be silicon nitride or some other material such as plasma-enhanced oxide (PEOX) or tetraethoxysilane (TEOS) oxide. The blanket deposition is followed by an anisotropic etch, which removes the spacer material except for the sidewall spacers 26, 28 immediately adjacent to the sidewalls 26, 28 of the polysilicon gate electrode 24 and over the substrate 10.

After formation of the sidewall spacers 36, 38, heavily doped (HDD) source/drain regions 40, 42 can be optionally formed by a second ion implantation, as represented by arrows 44. The HDD source/drain regions 40, 42 are formed within the substrate 10 and extend past the LDD source/drain regions 30, 32 immediately adjacent to the sidewall spacers 36, 38. The sidewall spacers 36, 38 act as masks, which protect portions of the LDD source/drain regions 30, 32 from being heavily doped and which prevent silicide formation on the sidewalls 26, 28 of the polysilicon gate electrode 24.

As seen in FIGS. 3G–3O, in current embodiments of the invention, a first nickel silicide layer 48 having a first thickness is formed over the source/drain regions 30, 32 and a second nickel silicide layer 58 having a second thickness is formed over the gate electrode 24. In preferred embodiments of the invention, the second thickness is greater than the first thickness. In this manner a polycide gate 24 having a thick nickel silicide layer 58 can be provided, which will advantageously increase the speed of the semiconductor device because of the lower resistance of the thick nickel silicide layer 58. Furthermore, this polycide gate 24 having a thick nickel silicide layer 58 can be provided without forming a thick nickel silicide layer over the source/drain regions 30, 32. Thus, the source/drain regions 30, 32 can remain shallow, which advantageously prevents unwanted source/drain-to substrate junction capacitance. This is because the penetration of the nickel silicide through the source/drain regions 30, 32 into the underlying substrate 10 is prevented.

The invention is not limited to a particular manner of providing a first nickel silicide layer 48 having a first thickness formed over the source/drain regions 30, 32 and a second nickel silicide layer 58 having a second thickness formed over the gate electrode 24, and any method or series of processing steps capable of providing such features is within the scope of the invention. FIGS. 3G–3O show an illustrative example of a series of processing steps capable of producing the aforementioned features, during which a nickel silicide layer 48 over the source/drain regions 30, 32 is formed first followed by formation of an additional nickel silicide layer 58 over the gate electrode 24. In an alternative embodiment of the invention, for example, the nickel silicide layer 58 over the gate electrode 24 can be formed first followed by formation of the additional nickel silicide layer 48 over the source/drain regions 30, 32. It should be understood, however, that other series of processing steps capable of providing a thin nickel silicide layer 48 formed over the source/drain regions 30, 32 and a second nickel silicide layer 58 formed over the gate electrode 24 other than those illustrated in FIGS. 3G–3O and discussed below can be employed without deviating from the scope of the invention.

In FIG. 3G, a first protective layer 50 is blanket deposited over the top surface of the substrate 10, although the invention is not limited as to a particular method of forming the first protective layer 50. The first protective layer 50 will subsequently be etched to form a protective layer over the gate electrode 24. In current embodiments of the invention, the first protective layer 50 has a thickness from about 300 to 1000 angstroms. The first protective layer 50 may comprise an oxide, such as silicon oxide, or a nitride, such as silicon nitride, for example. Other materials that adequately perform the described shielding function and can readily be selectively removed are also within the scope of the invention.

In FIG. 3H, the first protective layer 50 is patterned and etched using known techniques to remove portions of the first protective layer 50 to form a gate electrode protective layer 52. Alternatively, a polishing (e.g., chemical mechanical polishing), followed by cleaning and scrubbing, may be used to remove the first protective layer 50 from the gate electrode 24. The gate electrode protective layer 52 temporarily covers the gate electrode 24 and will prevent nickel silicide from forming over the gate electrode 24 during the immediately subsequent processing steps.

In FIG. 3I, nickel silicide is formed following the formation of the gate electrode protective layer 52. This process involves blanket depositing a thin layer of nickel 46 over the source/drain regions 30, 32 of the substrate 10 and the gate electrode protective layer 52. An illustrative example of a process capable of depositing the layer of nickel 46 is physical vapor deposition (PVD) from a nickel target. The thickness of the nickel layer 46 to be deposited is generally approximated at 1/2.1 times the desired thickness of the subsequently formed nickel silicide layer.

In FIG. 3J, the nickel layer 46 is transformed into nickel silicide 48 by a one-step thermal process, which causes the silicon in the source/drain regions 30, 32 of the substrate 10 to react with the nickel layer 46 to form a nickel silicide layer 48. This thermal process is commonly known as rapid thermal annealing. The temperature range during the rapid thermal anneal can be from about 380 to 600° C. for about 30 to 60 seconds in a nitrogen atmosphere. The thickness of the nickel silicide 48 layer is dependent upon the depth of the source/drain regions 30, 32, which is device dependent, and therefore can vary. In current embodiments of the invention, however, the thickness of the nickel silicide 48 over the source/drain regions 30, 32 can be from about 100 to 400 angstroms.

In FIG. 3K, the unreacted nickel layer 46 over the sidewall spacers 36, 38, the shallow isolation trench 12 (or field oxide), and the gate electrode protective layer 52 is removed. The unreacted nickel layer 46 can be removed using a wet chemical etch, and the wet chemical etch preferably exhibits high selectivity for the unreacted nickel 46 relative to the nickel silicide 48. In current embodiments of the invention, the etch is a sulfuric peroxide mixture $H_2SO_4:H_2O_2$ (3:1) with deionized $H_2O$ at a temperature of about 100° C. The removal rate of nickel at the 3:1 ratio is about 10,000 angstroms/minute.

After removing the unreacted nickel layer 46, a second protective layer 54 is blanket deposited over the top surface of the substrate 10. As with the first protective layer 50, the invention is not limited as to a particular method of depositing the second protective layer 54. In current embodiments of the invention, the second protective oxide layer 54 has a thickness from about 500 to 1000 angstroms.

In FIG. 3L, the second protective layer 54 is patterned and etched using known techniques to remove the gate electrode protective layer 52 and portions of the second protective layer 54. In this manner, the gate electrode 24 is exposed, and the second protective layer 54 covers the source/drain regions 30, 32 and will prevent additional nickel silicide from forming over the source/drain regions 30, 32 during subsequent processing steps.

In FIG. 3M, a second layer of nickel silicide, thicker than the first layer of nickel silicide 48, is formed on the gate electrode 24 following the formation of the patterning and etching of the second protective oxide layer 54. This process involves blanket depositing a thicker second layer of nickel 56 over the gate electrode 24. The thickness of the second nickel layer 56 to be deposited is generally approximated at 1/2.1 times the desired thickness of the subsequently formed nickel silicide layer. However, with a narrow gate electrode, the ratio of deposited nickel to nickel silicide can decrease. This ratio can decrease because nickel is the diffusing species in the nickel silicide formation, and when a nickel layer 56 is deposited over the gate electrode 24 and the sidewall spacers 36, 38, the nickel deposited over the sidewall spacers 36, 38 can diffuse into the gate electrode 24 to form nickel silicide. This effect becomes more pronounced as the width of the gate electrode 24 decreases.

In FIG. 3N, the second nickel layer 56 is transformed into a second layer of nickel silicide 58 by rapid thermal annealing. The total thickness of the gate electrode 24, including the second layer of nickel silicide 58, in current embodiments of the invention is about 1800 to 2000 angstroms. However, the invention is not limited in this manner, as the total thickness is device dependent, and therefore, the total thickness varies depending upon the device. In a preferred embodiment, the thickness of the nickel silicide 58 is not greater than about ¾ of the total gate thickness. As such, in the current embodiments of the invention, the thickness nickel silicide 58 over of the gate electrode 24 is preferably less than about 1350 to 1500 angstroms. Thus, the invention provides a layer of nickel silicide 58 over the gate electrode 24 that is greater than the thickness of the layer of nickel silicide 48 over the source/drain regions 30, 32.

In FIG. 3O, the unreacted nickel layer 56 over the sidewall spacers 36, 38, the shallow isolation trench 12 (or field oxide), and the source/drain regions 30, 32 is removed using conventional techniques, as discussed above. Also, the remainder of the second protective oxide layer 54 can be removed using conventional techniques.

By providing two nickel silicide layers, each having a different thickness, according to the invention, nickel silicide spiking through a shallow source/drain region can be prevented by providing a thin silicide layer over the source/drain regions. This minimizes the problem of junction leakage. Furthermore, a thick nickel silicide layer can be also provided over the gate electrode to decrease the resistance of the gate electrode, which allows for increased speed of the semiconductor device.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, comprising the steps of:

providing a gate electrode having first and second opposing sidewalls over a substrate having source/drain regions;

forming first and second sidewall spacers respectively disposed adjacent the first and second sidewalls;

forming a first protective layer over the gate electrode and the source/drain regions after formation of the first and second sidewall spacers;

exposing aine in a group consisting of the gate electrode adn the source/drain regions while maintaining the first protective layer over and other in the group consisting of the gate electrode and the source/drain regions;

forming a first nickel silicide layer on the exposed one in the group consisting of the gate eletrode and the source/drain regions;

forming a second protective layer over the gate electrode and source/drain regions;

exposing the other in the group constision of the gate electrode and the source/drain regions while maintaining the second protective layer over the one in the group consisting of the gate electrode and the source/drain regions; and, froming a second nickel silecide layer on the expond other in the group consisting of the gate electrode and the source/drain regions.

2. The method of manufacturing a semiconductor device according to claim 1, wherein the nickel silicide layer on the gate electrode is thicker than the nickel silicide layer on the source/drain regions.

3. The method of manufacturing a semiconductor device according to claim 2, wherein the thickness of the nickel silicide layer on the source/drain regions is from about 100 to 400 angstroms.

4. The method of manufacturing a semiconductor device according to claim 2, wherein the thickness of the nickel silicide layer on the gate electrode is from about 1350 to 1500 angstroms.

5. The method of manufacturing a semiconductor device according to claim 1, wherein the nickel silicide layer on the gate electrode is formed before the nickel silicide layer on the source/drain regions.

6. The method of manufacturing a semiconductor device according to claim 1, wherein the nickel silicide layer on the source/drain regions is formed before the nickel silicide layer on the gate electrode.

7. The method of manufacturing a semiconductor device according to claim 6, wherein the source/drain regions are exposed by patterning and etching the first protective layer to form a gate electrode protective layer over the gate electrode.

8. The method of manufacturing a semiconductor device according to claim 7, wherein the gate electrode protective layer has a thickness from about 300 to 1000 angstroms.

9. The method of manufacturing a semiconductor device according to claim 6, wherein the first nickel silicide layer is formed by depositing a first nickel layer over the source/drain regions and the gate electrode followed by annealing.

10. The method of manufacturing a semiconductor device according to claim 9, further comprising the step of removing unreacted nickel after the first nickel silicide layer is formed.

11. The method of manufacturing a semiconductor device according to claim 7, wherein the gate electrode is exposed by patterning and etching the second protective layer and the gate electrode protective layer.

12. The method of manufacturing a semiconductor device according to claim 6, wherein the second nickel silicide layer is formed by depositing a second nickel layer over the source/drain regions and the gate electrode followed by annealing.

13. The method of manufacturing a semiconductor device according to claim 12, further comprising the step of removing unreacted nickel after the second nickel silicide layer is formed.

14. The method of manufacturing a semiconductor device according to claim 6, wherein the second protective layer has a thickness from about 500 to 1000 angstroms.

* * * * *

UNITED STATES PATENT AND TRADEMARK OFFICE
CERTIFICATE OF CORRECTION

PATENT NO.    : 6,562,717 B1
DATED         : May 13, 2003
INVENTOR(S)   : Christy Mei-Chu Woo et al.

It is certified that error appears in the above-identified patent and that said Letters Patent is hereby corrected as shown below:

Column 11,
Line 35, change "aine" to -- one --;
Line 36, change "and" to -- and --;
Line 37, change "over and other" to -- over an other --;
Line 44, change "consistion" to -- consisting --;
Line 49, change "froming" to -- forming --; "silecide" to -- silicide --; and "expond" to -- exposed --.

Signed and Sealed this

Twenty-second Day of July, 2003

JAMES E. ROGAN
*Director of the United States Patent and Trademark Office*